US009105738B2

(12) United States Patent
Sekine

(10) Patent No.: US 9,105,738 B2
(45) Date of Patent: Aug. 11, 2015

(54) SEMICONDUCTOR DEVICE AND METHOD OF MANUFACTURING THE SAME

(75) Inventor: Katsuyuki Sekine, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 202 days.

(21) Appl. No.: 13/616,735

(22) Filed: Sep. 14, 2012

(65) Prior Publication Data

US 2013/0240968 A1    Sep. 19, 2013

(30) Foreign Application Priority Data

Dec. 21, 2011  (JP) .................................. 2011-279694

(51) Int. Cl.
| | |
|---|---|
| *H01L 29/792* | (2006.01) |
| *H01L 21/28* | (2006.01) |
| *H01L 29/40* | (2006.01) |
| *H01L 29/423* | (2006.01) |
| *H01L 29/66* | (2006.01) |
| *H01L 29/788* | (2006.01) |
| *H01L 27/115* | (2006.01) |

(52) U.S. Cl.
CPC ........ *H01L 29/792* (2013.01); *H01L 21/28273* (2013.01); *H01L 27/11521* (2013.01); *H01L 29/401* (2013.01); *H01L 29/42324* (2013.01); *H01L 29/66825* (2013.01); *H01L 29/7883* (2013.01); *H01L 29/42336* (2013.01)

(58) Field of Classification Search
USPC ............................................... 257/315–322
See application file for complete search history.

(56) References Cited

U.S. PATENT DOCUMENTS

| | | | |
|---|---|---|---|
| 7,485,918 B2 | 2/2009 | Yamamoto et al. | |
| 7,612,404 B2 | 11/2009 | Yamamoto et al. | |
| 7,679,127 B2 | 3/2010 | Shiozawa et al. | |
| 2008/0277716 A1 | 11/2008 | Nishida et al. | |
| 2008/0296663 A1 | 12/2008 | Takeuchi et al. | |
| 2010/0213534 A1* | 8/2010 | Sekine et al. ................. | 257/321 |
| 2010/0308393 A1 | 12/2010 | Matsuo et al. | |
| 2011/0169068 A1 | 7/2011 | Lee et al. | |

FOREIGN PATENT DOCUMENTS

| | | |
|---|---|---|
| JP | 2007-287857 | 11/2007 |
| JP | 2007-305668 | 11/2007 |
| JP | 2008-277694 | 11/2008 |
| JP | 2008-300427 | 12/2008 |
| JP | 2010-219517 | 9/2010 |
| JP | 2010-283127 | 12/2010 |

* cited by examiner

*Primary Examiner* — Matthew W Such
*Assistant Examiner* — Robert Carpenter
(74) *Attorney, Agent, or Firm* — Oblon, McClelland, Maier & Neustadt, L.L.P.

(57) ABSTRACT

A semiconductor device includes a multilayered interelectrode insulating film formed between a charge storage layer and a control electrode layer. The interelectrode insulating film is formed in a first region above an upper surface portion of the element isolation insulating film, a second region along a sidewall portion of the charge storage layer, and a third region above an upper surface portion of the charge storage layer. The interelectrode insulating film includes a stack of first silicon oxide film, a silicon nitride film, and a second silicon oxide film. The silicon nitride film is relatively thicker in the third region compared to the first region and compared to at least a portion of the second region.

21 Claims, 10 Drawing Sheets

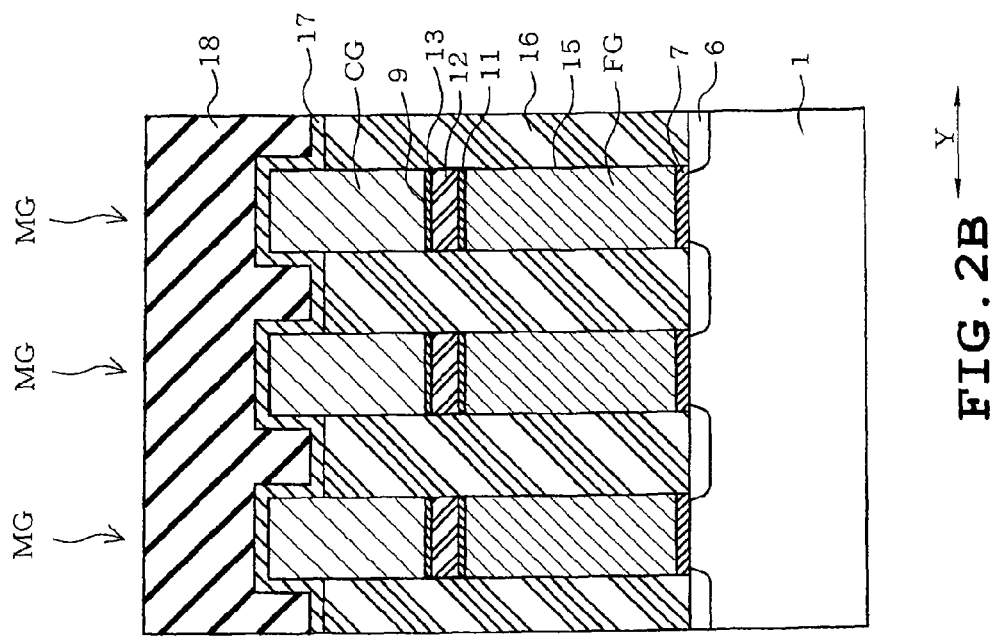
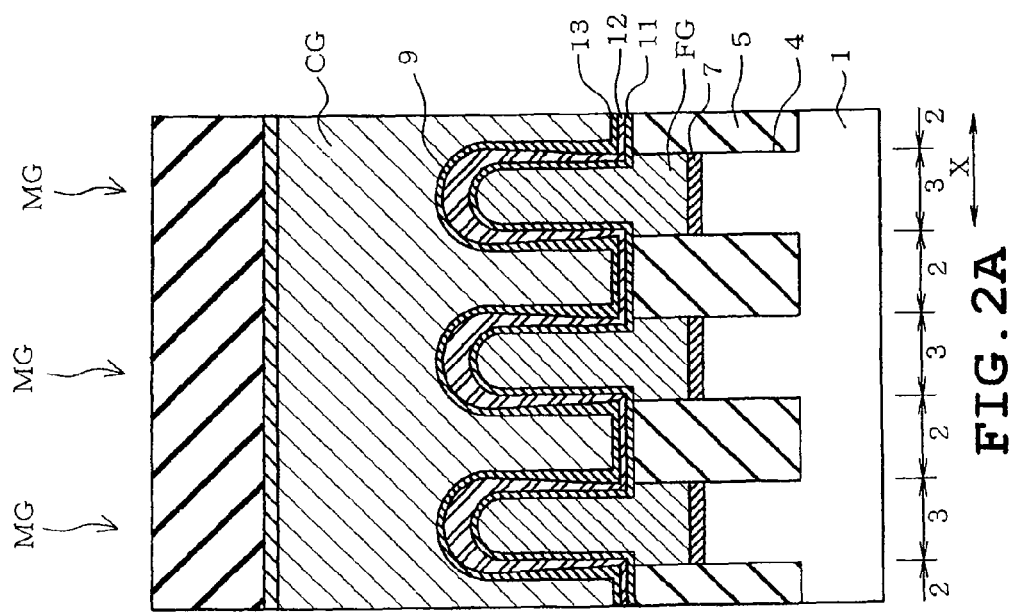
FIG. 2A
FIG. 2B

SEMICONDUCTOR DEVICE AND METHOD OF MANUFACTURING THE SAME

CROSS-REFERENCE TO RELATED APPLICATION(S)

This application is based upon and claims the benefit of priority from Japanese Patent Application No. 2011-279694, filed on, Dec. 21, 2011 the entire contents of which are incorporated herein by reference.

FIELD

Embodiments disclosed herein generally relate to a semiconductor device and a method of manufacturing the same.

BACKGROUND

A flash memory is typically configured by an array of multiplicity of memory cells aligned in the word line direction and the bit line direction. A memory cell is configured by a stacked gate structure in which a floating gate electrode, an interelectrode insulating film, and a control gate electrode are stacked in the listed sequence. As flash memory increases its storage capacity through densification, features within the memory cell are packed in tighter dimensions. Dimensions typically affected by the densification are widths of floating gate electrodes and element isolation trenches.

For instance, narrowing of the element isolation trenches makes formation of control gate electrode difficult since polysilicon film, typically employed as a control gate electrode material, needs to be filled in the narrowed gaps between the neighboring floating gate electrodes which are further narrowed by the presence of the interelectrode insulating film. One solution to this problem may be thinning the interelectrode insulating film.

Further, narrowing the width of the floating gate electrode subjects the floating gate electrode to relatively higher electric field through the interelectrode insulating film. This is because the width scaling often results in a floating gate electrode with a sharp tip which causes concentration and enhancement of electric field. The electric field concentration increases the risk of leakage current which negatively impacts the programming properties.

BRIEF DESCRIPTION OF THE DRAWINGS

FIG. 2A is a cross sectional view taken along line A-A of FIG. 1;

FIG. 2B is a cross sectional view taken along line B-B of FIG. 1;

DETAILED DESCRIPTION

In one embodiment, a semiconductor device is disclosed. The semiconductor device includes a semiconductor substrate; an element isolation region defined in the semiconductor substrate and having an element isolation insulating film formed therein; an active region defined in the semiconductor substrate delineated by the element isolation region; a gate insulating film formed in the active region; a charge storage layer formed above the gate insulating film; and a multilayered interelectrode insulating film formed in a first region above an upper surface portion of the element isolation insulating film, a second region along a sidewall portion of the charge storage layer, and a third region above an upper surface portion of the charge storage layer. The interelectrode insulating film includes a stack of first silicon oxide film, a silicon nitride film, and a second silicon oxide film. The silicon nitride film is relatively thicker in the third region compared to the first region and compared to at least a portion of the second region. The semiconductor device further includes a control electrode layer formed above the interelectrode insulating film.

In one embodiment, a method of forming a semiconductor device is disclosed. The method includes forming a gate insulating film above a semiconductor substrate; forming a charge storage layer above the gate insulating film; forming an element isolation trench into the charge storage layer, the gate insulating film, and the semiconductor substrate; filling the element isolation trench with an element isolation insulating film; and exposing an upper surface and an upper sidewall of the charge storage layer. The method further includes forming, in a first region above an upper surface portion of the element isolation insulating film, a second region along a sidewall portion of the charge storage layer, and a third region above an upper surface portion of the charge storage layer, a first silicon oxide film, a silicon nitride film above the first silicon oxide film, and a second silicon oxide film above the silicon nitride film to obtain a multilayered interelectrode insulating film. The silicon nitride film is formed relatively thicker in the third region compared to the first region and compared to at least a portion of the second region. A control electrode layer is further formed above the interelectrode insulating film.

Embodiments are described hereinafter with reference to the accompanying drawings. Elements that are identical or similar are represented by identical or similar reference symbols across the figures. The drawings are not drawn to scale and thus, do not reflect the actual measurements of the features such as the correlation of thickness to planar dimensions and the relative thickness of different layers.

Figure 1:
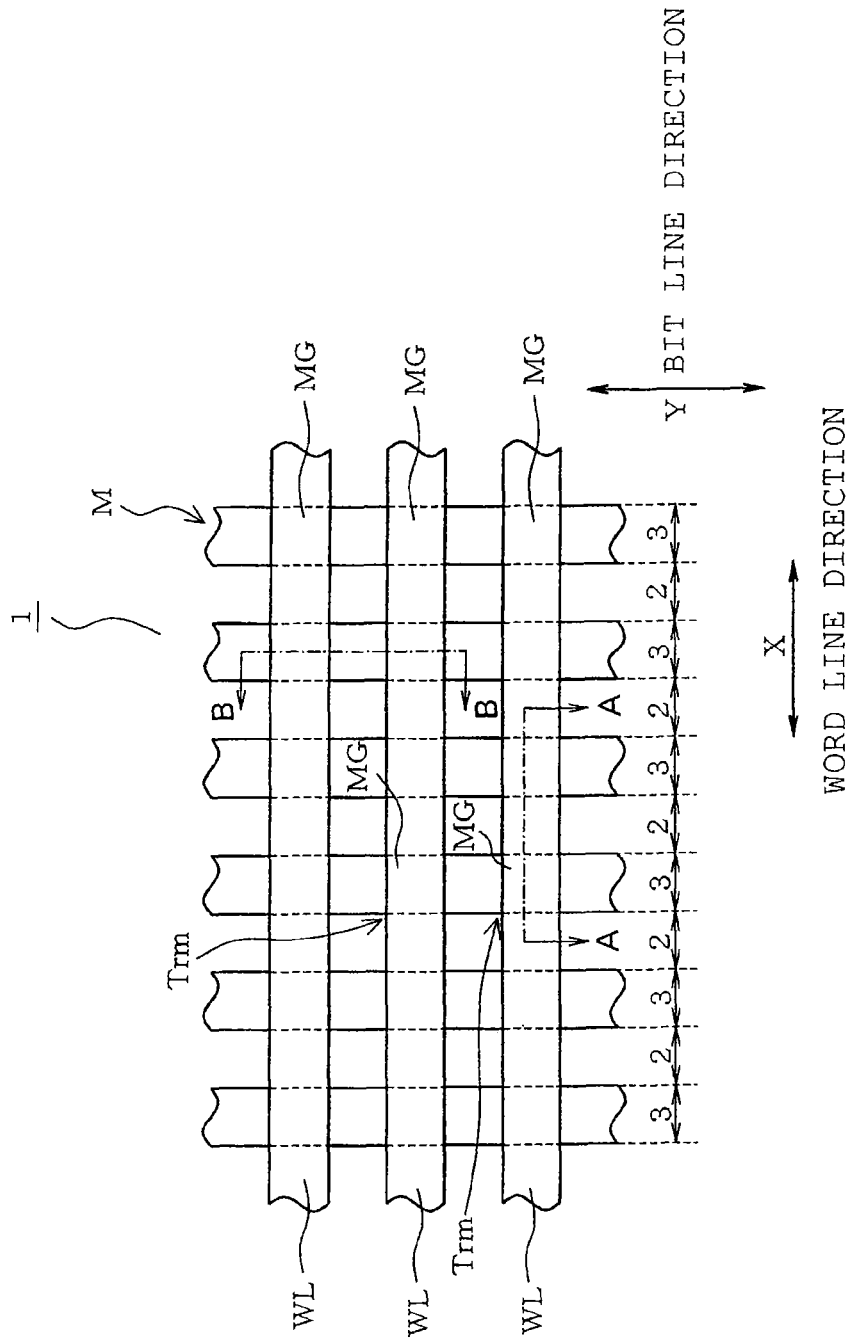
FIG. 1 schematically illustrates the planar structure of a memory cell region of a first embodiment.

A first embodiment of a semiconductor device is described through an example of a nonvolatile semiconductor storage device. FIG. 1 schematically illustrates the planar structure of a memory cell region of the nonvolatile semiconductor storage device. As shown in FIG. 1, memory cell region M contains multiplicity of memory cell transistors Trm in a matrix alignment along the word line WL direction X and the bit line direction Y. A peripheral circuit not shown reads, programs, and erases the data stored in memory cell transistors Trm. NAND flash memory is a typical example of a nonvolatile semiconductor storage device employing such memory cell structure. NAND flash memory is typically configured by an array of NAND strings or units of cells in which a plurality of memory cell transistors Trm are series connected between a pair select transistors not shown.

FIG. 2A is a cross sectional view taken along line A-A of FIG. 1 which extends along word line WL and the width direction of the channel of each memory cell. FIG. 2B is a cross sectional view taken along line B-B of FIG. 1 which extends along the bit line and the length direction of the channel of each memory cell. The gate electrode structure within memory cell region M of the first embodiment is discussed with reference to FIGS. 2A and 2B.

As can be seen in FIGS. 2A and 2B the P-type silicon substrate 1 has element isolation trenches 4 formed in its surface layer. Element isolation trenches 4 isolate multiplicity of active regions 3 in word line WL direction represented as the X direction as viewed in FIG. 1. Each element isolation trench 4 is filled with element isolation insulating film 5 to form element isolation region 2 employing an SIT (Shallow Trench Isolation) scheme.

Memory cell transistor Trm includes an n-type diffusion layer 6 formed in silicon substrate 1, gate insulating film 7 formed above silicon substrate 1, and gate electrode MG formed above gate insulating film 7. Gate electrode MG includes floating gate electrode FG serving as a charge storage layer, interelectrode insulating film 9 formed in the region above the upper surface of floating gate electrode FG, and control gate electrode CG serving as a control electrode layer. Diffusion layer 6 is formed in the surface layer of silicon substrate 1 situated beside gate electrode MG of memory cell transistor Trm and serves as the source/drain region of memory cell transistor Trm.

Gate insulating film 7 also referred to as tunnel insulating film 7, is formed in active region 3 which is delineated by element isolation insulating film 5 filled in the element isolation trenches 4. Gate insulating film 7 typically comprises a silicon oxide film. Floating gate electrode FG formed above gate insulating film 7, serving as a charge storage layer as described earlier, typically comprises polycrystalline silicon layer 8 also referred to as conductive layer 8 doped with impurities such as phosphorous.

Interelectrode insulating film 9 takes a multilayered ONO structure in which a layer of first silicon oxide film 11, a layer of silicon nitride film 12, and a layer of second silicon oxide film 13 are stacked in the listed sequence in the region above the upper surface of element isolation insulating film 5 and the sidewall and the upper surface of floating gate electrode FG. Interelectrode insulating film 9 may also be referred to as an interpoly insulating film and inter-conductive-layer insulating film.

Silicon nitride film 12 of interelectrode insulating film 9 is configured so as to be relatively thicker in the region above the upper surface of floating gate electrode FG and relatively thinner in at least a portion of the region along the sidewall of floating gate electrode FG and in the region above the upper surface of element isolation insulating film 5. In the example shown in FIG. 2A, silicon nitride film 12 is made relatively thin along the entire length of the region along the sidewall of floating gate electrode FG. Silicon nitride film 12 located along the sidewall of floating gate electrode FG may be further configured to become gradually thinner as elevation decreases, meaning that silicon nitride film 12 is relatively thinner at the foot of floating gate electrode FG as compared to the top or the upper portion of floating gate electrode FG. The thickness of first silicon oxide film 11 and second silicon oxide film 13 are substantially uniform and do not vary substantially depending on location.

Control gate electrode CG formed above interelectrode insulating film 9 comprises conductive layer 10. In other words, conductive layer 10 serves globally as word line WL extending across the memory cell array and locally as control gate electrode CG for each memory cell. Conductive layer 10 is typically configured as a stack of a polycrystalline silicon layer doped with impurities such as phosphorous and a silicide layer residing directly on top of the polycrystalline silicon layer. The silicide layer comprises a silicide of either of metals such as tungsten (W), cobalt (Co), and nickel (Ni). The silicide layer of the first embodiment employs a nickel silicide (NiSi). In an alternative embodiment, conductive layer 10 may be fully silicided.

As can be seen in FIG. 2B, gate electrodes MG of memory cell transistors Trm are electrically isolated in the Y direction by gaps 15. Gaps 15 are filled with inter-memory-cell insulating film 16 which typically comprises a silicon oxide film such as TEOS (tetraethyl orthosilicate) or a low dielectric constant insulating film.

Above the upper surface of inter-memory-cell insulating film 16, and the upper surface and the upper sidewall of control gate electrode CG, liner insulating film 17 is formed which comprises, for example, a silicon nitride film. Further above liner insulating film 17, interlayer insulating film 18 is formed which typically comprises a silicon oxide film. Liner insulating film 17 serves as a barrier to keep the oxidant used in the formation of interlayer insulating film 18 away from control gate electrode CG. One of the advantages of providing liner insulating film 17 is that it prevents oxidation of the silicide layer of conductive layer 10 which may cause elevation in the resistance level of word line WL. Because liner insulating film 17, comprising a silicon nitride film in the first embodiment, does not fully fill gap 15 between control gate electrodes CG, the risk of increased parasitic capacitance that may lead to wiring delay can be minimized.

The above described nonvolatile semiconductor storage device is configured to erase/program the data stored in the memory cell by applying high electric field, drawn from the peripheral circuit not shown, between word line WL and P-well of silicon substrate 1 as well as applying suitable predetermined voltage on electric elements such as the source and drain. For instance, when programming, the peripheral circuit applies a high level voltage on the selected word line WL while applying a low level voltage on P-well, etc., provided in silicon substrate 1. When erasing, the peripheral circuit applies a low level voltage on the selected word line WL while applying a high level voltage on P-well, etc. of silicon substrate 1.

Figure 9:
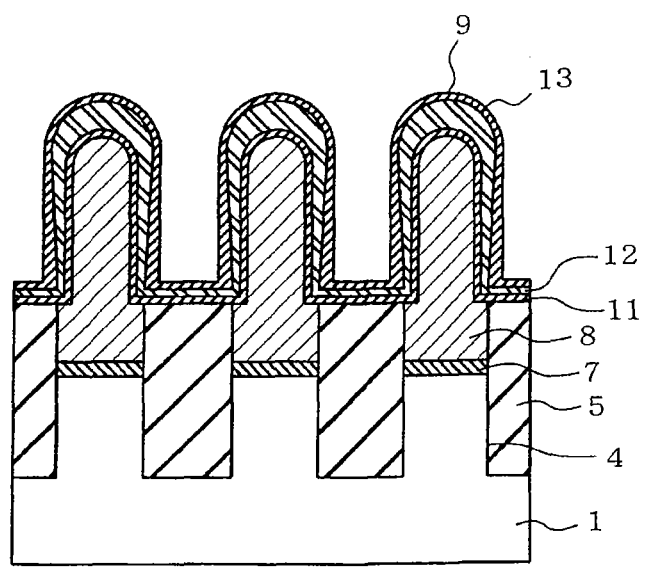
Figure 10:
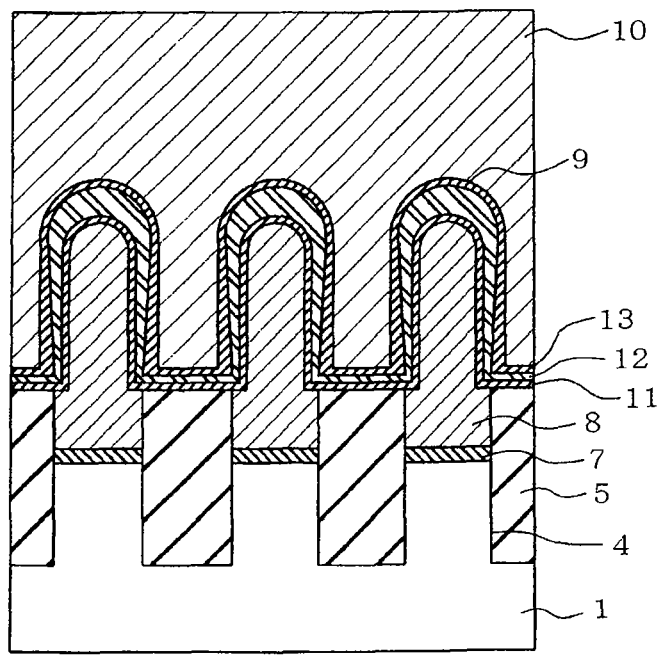
Figure 11:
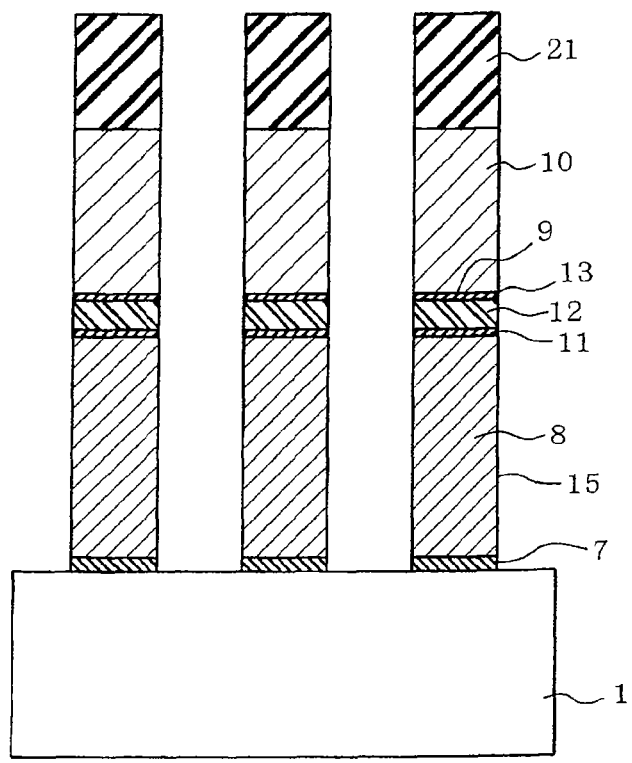
FIG. 11 depicts a cross section taken along line B-B of FIG. 1 and illustrates one phase of a manufacturing process flow of the memory cell region.

Referring to FIGS. 3 to 11, a description will be given on the process flow for manufacturing the above described nonvolatile semiconductor storage device. FIGS. 3 to 10 are schematic cross sectional views of memory cell region M taken along line A-A of FIG. 1 at different stages of the manufacturing process flow. FIG. 11 is a cross sectional view of memory cell region M taken along line B-B of FIG. 1.

Figure 3:
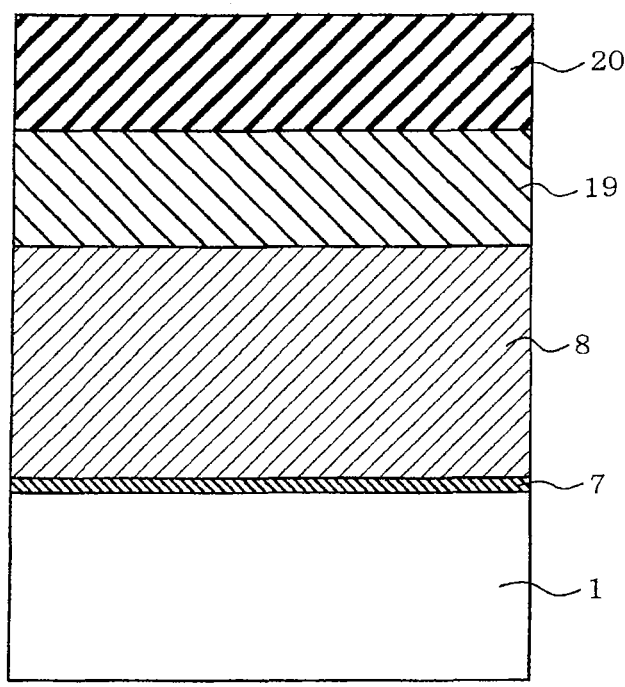
FIGS. 3, 4, 5, 6, 7, 8, 9, and 10 each depict a cross section taken along line A-A of FIG. 1 and illustrate one phase of a manufacturing process flow of the memory cell region.

Referring to FIG. 3, approximately 6 nm of gate insulating film 7 is formed above the upper surface of silicon substrate 1 which is doped with impurities. Gate insulating film 7 serves as a tunnel insulating film. Then, above gate insulating film 7, approximately 100 nm of polycrystalline silicon layer 8 doped with phosphorus is formed by CVD (Chemical Vapor Deposition). Polycrystalline silicon layer 8, as described earlier, constitutes floating gate electrode FG that serves the charge storage layer.

Then, silicon nitride film 19 later used as a mask is formed by CVD which is followed by CVD formation of another mask made of silicon oxide film 20. Silicon oxide film 20 is thereafter coated with a photoresist not shown which is subsequently patterned through exposure and development.

Figure 4:
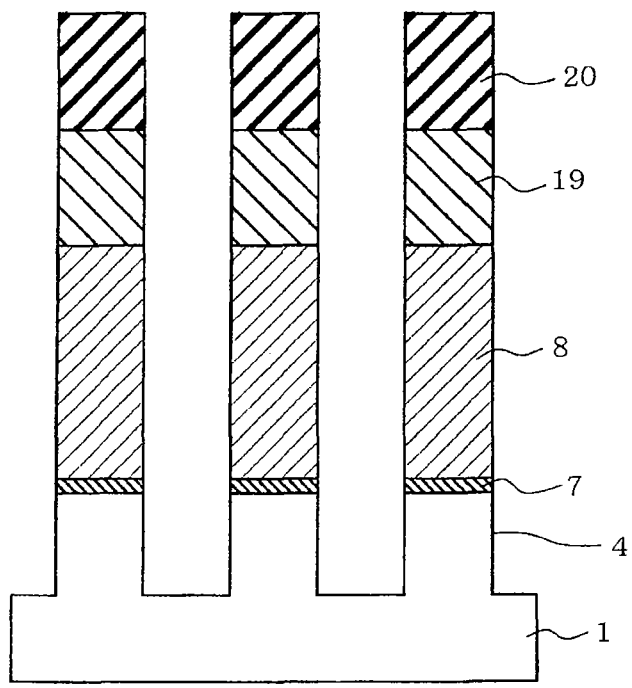

Then, using the patterned photoresist as a mask also referred to as a first resist mask hereinafter, the underlying silicon oxide film 20 is etched by RIE (Reactive Ion Etching). Photoresist is thereafter removed and silicon oxide film 20 is further used as a mask to etch the underlying silicon nitride film 19 by RIE, which is in turn used as a mask to etch polycrystalline silicon layer 8, gate insulating film 7, and silicon substrate 1 to form element isolation trench 4 as can be seen in FIG. 4. According to the first embodiment, the widths of both active region 3 and element isolation trench 4 are configured at approximately 50 nm.

Figure 5:
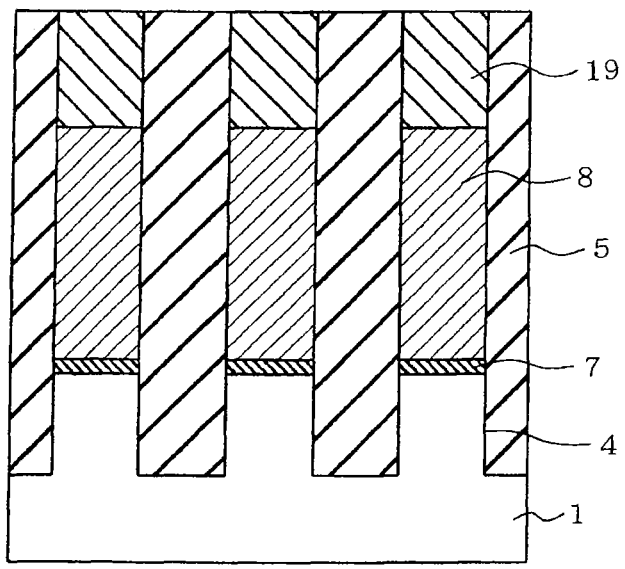
Figure 6:
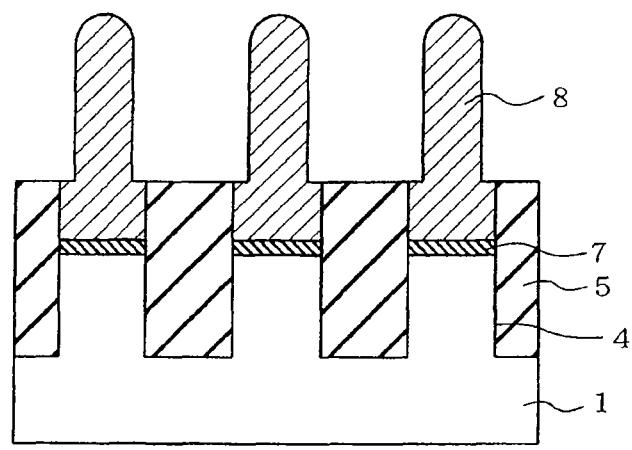

Then, element isolation trench 4 is overfilled with element isolation insulating film 5 such that the overflow of element isolation insulating film 5 is further blanketed over silicon oxide film 20. Element isolation insulating film 5 comprises a silicon oxide film typically formed by SOG (Spin On Glass) materials such as polysilazane. Then, silicon oxide film 20 is thereafter polished away by CMP (Chemical Mechanical Polishing) using the underlying silicon nitride film 19 as a polish stop to remove the excess element isolation insulating film 5 while leaving element isolation insulating film 5 within element isolation trench 4 as shown in FIG. 5.

Then, silicon nitride film 19, used as an etch mask and a polish stop, is removed by wet etching to expose the upper surface of polycrystalline silicon layer 8. Further, the upper portion of element isolation insulating film 5 is removed by wet etching typically employing a solution of diluted hydrofluoric acid. The element isolation insulating film 5 in memory cell region M in particular is etched until approximately 50 nm of the upper sidewall of polycrystalline silicon layer 8 is exposed to obtain a sharp pointed structure exemplified in FIG. 6.

Figure 7:
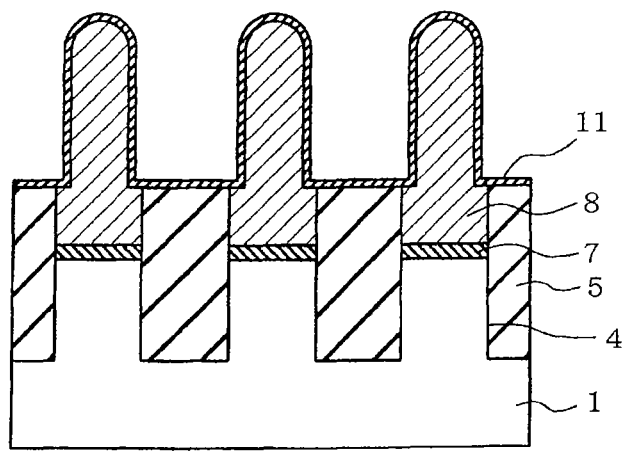
Figure 8:
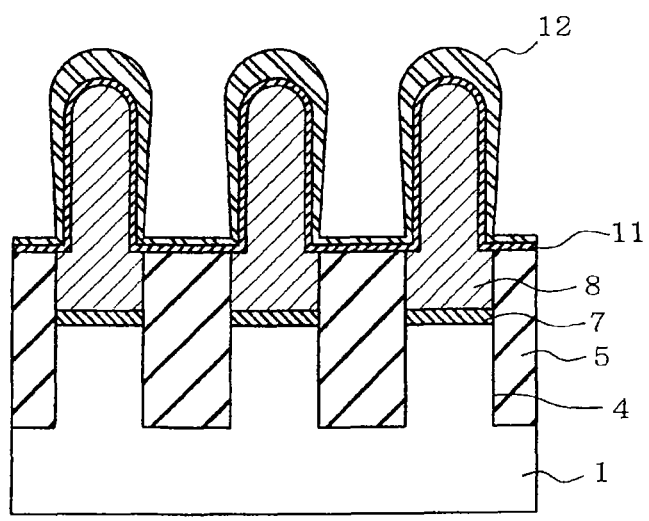

Next, as shown in FIGS. 7 to 9, interelectrode insulating film 9 is blanketed above the underlying structure i.e. upper surface of element isolation insulating film 5, and the upper sidewall and the upper surface of polycrystalline silicon layer 8 later formed into floating gate electrode FG.

More specifically, first silicon oxide film 11 is formed so as to be substantially uniform in thickness as shown in FIG. 7. First silicon oxide film 11 may be formed by LP-CVD (Low Pressure Chemical Vapor Deposition) using source gases such as DCS (Dichlorosilane, $SiH_2Cl_2$)+$N_2O$ or $Si_2H_6$+$N_2O$. Alternatively, first silicon oxide film 11 may be formed by ALD (Atomic Layer Deposition) using source gases such as 3DMAS (trisdimethylaminosilane, $HSi[N(CH_3)_2]_3$)+$O_3$ or HCD (Hexachloro Disilane, $Si_2Cl_6$)+$H_2O$.

Then, as shown in FIG. 8, silicon nitride film 12 is formed above first silicon oxide film 11. Silicon nitride film 12 may be formed by PE-CVD (Plasma Enhanced Chemical Vapor Deposition) or PE-ALD (Plasma Enhanced Atomic Layer Deposition) exhibiting bad or low step coverage preferably using source gases such as disilane and ammonium/nitrogen. The resulting silicon nitride film 12 is thus relatively thicker in the region above the upper surface of floating gate electrode FG and relatively thinner in at least a portion of the region along the sidewall of floating gate electrode FG and in the region above the upper surface of element isolation insulating film 5. The resulting silicon nitride film 12 located along the sidewall of floating gate electrode FG is further configured to become gradually thinner as elevation decreases, meaning that silicon nitride film 12 is relatively thinner at the foot of floating gate electrode FG as compared to the upper portion of floating gate electrode FG. The thickest portion of silicon nitride film 12 is controlled to fall within the range of 3 to 10 nm and thus, it is preferable to employ PE-ALD which provides good thickness control. The PE-ALD may preferably use a source gas such as disilane and be executed in at temperatures ranging from 300 to 500 degrees Celsius. The exemplified temperature range advantageously produces silicon nitride film 12 of good quality.

Then as shown in FIG. 9, second silicon oxide film 13 is formed so as to be substantially uniform in thickness. Second silicon oxide film 13 may be formed by LP-CVD using source gases such as DCS+$N_2O$ or $Si_2H_6$+$N_2O$. Alternatively, second silicon oxide film 13 may be formed by ALD using source gases such as 3DMAS+$O_3$ or HCD+$H_2O$.

After forming interelectrode insulating film 9 as described above, a phosphorous-doped polycrystalline silicon layer 10 serving as control gate electrode CG is formed by LP-CVD in the thickness of approximately 100 nm as shown in FIG. 10.

Referring now to FIG. 11, silicon nitride film 21 is formed above polycrystalline silicon layer 10 typically by CVD that serves as a mask in the subsequent RIE. Further above silicon nitride film 21, a second resist mask not shown is formed which contains patterns that are oriented orthogonal to the patterns of the first resist mask mentioned earlier. Then, using the second resist mask, silicon nitride film 21, polycrystalline silicon layer 10, interelectrode insulating film 9, polycrystalline silicon layer 8, and gate insulating film 7 are etched in the listed sequence to form gap 15 for electrode isolation as shown in FIG. 11. The above series of processes form the stacked gate structure composed of floating gate electrode FG, interelectrode insulating film 9, and control gate electrode CG. The width of each stacked gate structure as well as the spacing between the stacked gate structures are approximately 50 nm.

Then, a spacer film not shown being approximately 10 nm thick is formed along the sidewall of the gate structure by thermal oxidation and CVD. Using the spacer film as a mask, impurity diffusion layer 6 shown in FIG. 2B, serving as the source/drain region, is formed by ion implantation and thermal anneal. Then, within gap 15, inter-memory-cell insulating film 16 shown in FIG. 2B is formed which is thereafter planarized and lowered in elevation. Further, the upper portion of polycrystalline silicon layer 10 is formed into a nickel silicide layer, followed by formation of liner insulating film 17 and interlayer insulating film 18 as shown in FIG. 2B. Then, known techniques are used to form interconnects, etc. not shown.

The end result of the above described process flow provides a nonvolatile semiconductor storage device configured by gate insulating film 7 formed above silicon substrate 1, floating gate electrode FG formed above gate insulating film 7, interelectrode insulating film 9 formed above floating gate electrode FG, control gate electrode CG formed above interelectrode insulating film 9, and impurity diffusion layer 6 formed beside the channel region located below floating gate electrode FG.

Each of the memory cells of such nonvolatile semiconductor storage device is typically erased/programmed by applying a high level voltage between silicon substrate 1 and control gate electrode CG, whereby electric field intensified in correlation with the coupling ratio is applied to gate insulating film 7 to cause tunneling current to flow through gate insulating film 7. Responsively, amount of stored charge within floating gate electrode FG is varied, causing a shift in the threshold voltage to either program or erase the memory cell. In operation, multiplicity of memory cells are aligned in a matrix along word lines WL and the bit lines. One application of the nonvolatile semiconductor storage device configured as described above is a NAND flash memory in which a plurality of series connected memory cells are disposed between select transistors.

Next, a description will be given on the structure, operation and the advantages of interelectrode insulating film 9 configured as set forth in the first embodiment.

Interelectrode insulating film 9 is configured such that silicon nitride film 12 is relatively thick in the region above the upper surface of floating gate electrode FG and relatively thin at least in a portion of the region along the sidewall of floating gate electrode FG. Accordingly, the physical thickness of interelectrode insulating film 9 becomes relatively thick in the region above the upper surface of the floating gate electrode FG where electric field concentration occurs, thereby reducing leakage current during programming and consequently improving the programming properties.

Further, silicon nitride film 12 located in the region above the upper surface of floating gate electrode FG and between first silicon oxide film 11 and second silicon oxide film 13 is made relatively thick. This facilitates trapping of electrons into silicon nitride film 12 during programming to build up charge within silicon nitride film 12. The increased thickness and the built up charge relaxes the electric field which in turn reduces leakage current of interelectrode insulating film 9, consequently improving the memory window and tolerance to read disturbs. The memory window indicates the difference in the voltage level of program threshold and erase threshold.

Further, because silicon nitride film 12 located in at least a portion of the region along the sidewall of floating gate electrode FG is made relatively thin, the gaps between the neighboring floating gate electrodes FG become relatively wider. The widened gap facilitates the filling of conductive layer 10 later formed into control gate electrode CG and consequently improves the product yield. The electric field applied on the region along the sidewall of floating gate electrode FG is relatively weak as compared, for example to the region above the upper surface of floating gate electrode. Thus, reducing the physical thickness of interelectrode insulating film 9 in this region will not negatively impact the programming properties.

Further, portions of silicon nitride film 12 located in the vicinity of the upper surface of element isolation insulating film 5, which may include at least a portion of silicon nitride film 12 located in the region along the sidewall of floating gate electrode FG and silicon nitride film 12 located above the upper surface of element isolation insulating film 5, are made relatively thin. As a result, portions of silicon nitride film 12 located near gate insulating film 7 are made relatively thin, thereby reducing the amount of electrons or electric charge being trapped in these portions. Reduced charge trapping in the vicinity of gate insulating film 7 advantageously reduces the difference between the target threshold voltage and the actual threshold voltage in the programming operation, thereby narrowing the threshold distribution and consequently reducing program errors and improving the reliability of the memory cells.

Figure 12:
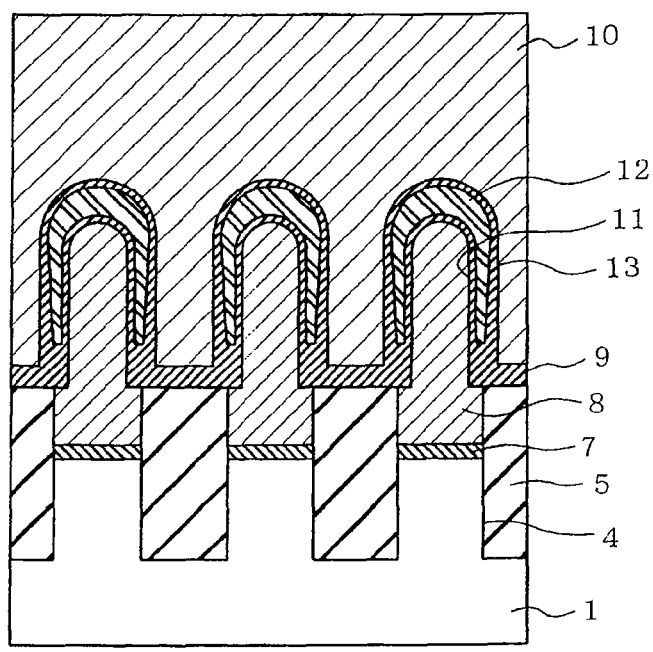
FIG. 12 corresponds to FIG. 10 and illustrates as second embodiment.
Figure 13:
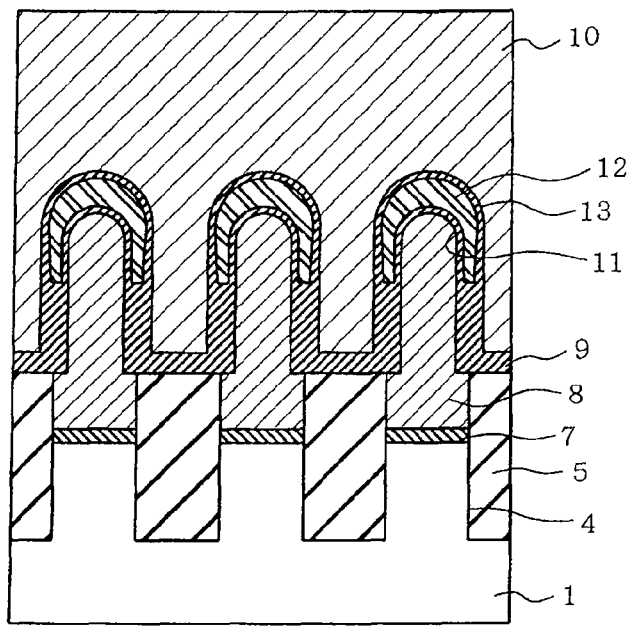
FIG. 13 is a variation of the feature illustrated in FIG. 12.
Figure 14:
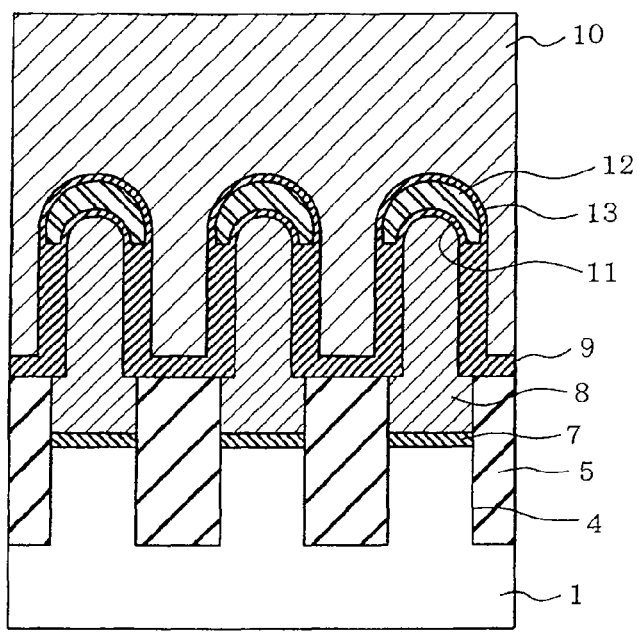
FIG. 14 is another variation of the feature illustrated in FIG. 12.

FIGS. 12, 13, and 14 illustrate a second embodiment and portions that are identical to the first embodiment are identified with identical reference symbols. As shown in FIGS. 12, 13, and 14, the second embodiment is configured such that silicon nitride film 12 of interelectrode insulating film 9 is present in the region above the tip or the upper surface of floating gate electrode FG and along the upper portion of the sidewall near the tip but absent in the region along the lower portion of the sidewall away from the tip and above the upper surface of element isolation insulating film 5.

FIGS. 12, 13, and 14 illustrate the above described feature with variation in the length of silicon nitride film 12 running downward along the sidewall of floating gate electrode FG from the tip. As apparent from the figures, FIG. 12 has the longest length of silicon nitride film 12 and the length becomes shorter in FIG. 13 and the shortest in FIG. 14.

The manufacturing process flow of the second embodiment follows the process flow of the first embodiment up to FIG. 8 in which silicon nitride film 12 of interelectrode insulating film 9 is formed above first silicon oxide film 11. Then by exposure to an atmosphere of oxidizing radicals or $O_3$, at least a portion of silicon nitride film 12 formed along the sidewall of floating gate electrode FG and silicon nitride film 12 formed above the upper surface of element isolation insulating film 5 is transformed into a silicon oxide film and eventually dissipated. Thereafter, second silicon oxide film 13 is formed above silicon nitride film 12 and first silicon oxide film 11 as done in the first embodiment. The rest of the manufacturing process flow may follow the first embodiment.

Instead of exposing the formed silicon nitride film 12 to the atmosphere of oxidizing radicals or $O_3$ in the above described manufacturing process flow, LP-CVD may be performed for forming second silicon oxide film 13 above silicon nitride film 12 at higher temperature level than usual or with increased supply of oxidant such as oxidizing radicals or $O_3$. This alternative approach also oxidizes and eventually dissipates at least a portion of the thin silicon nitride film 12 formed along the sidewall of floating gate electrode FG and silicon nitride film 12 formed above the upper surface of element isolation insulating film 5. The rest of the structures of the second embodiment remain the same from those of the first embodiment and thus, the second embodiment is similar to the first embodiment in operation and effect.

As described above, the second embodiment is configured such that silicon nitride film 12 is absent from the region above the upper surface of element isolation insulating film 5 and from at least a portion of the region along the sidewall of floating gate electrode FG located away from the upper surface or the tip of floating gate electrode FG. This advantageously prevents transport of charge, which was trapped into silicon nitride film 12 located near the tip of floating gate electrode FG during programming, in the subsequent charge retention and reading performed on the relevant cell as well as in the programming of the adjacent cells. Thus, shifts in threshold voltage Vth can be reduced in the memory cells. Even in the presence of difference in electric field strength with the adjacent memory cells, charge transport to/from the adjacent memory cells can be prevented by the above described arrangement. The second embodiment thus, provides a memory cell array which is tolerant to inter-cell interference.

Figure 15:
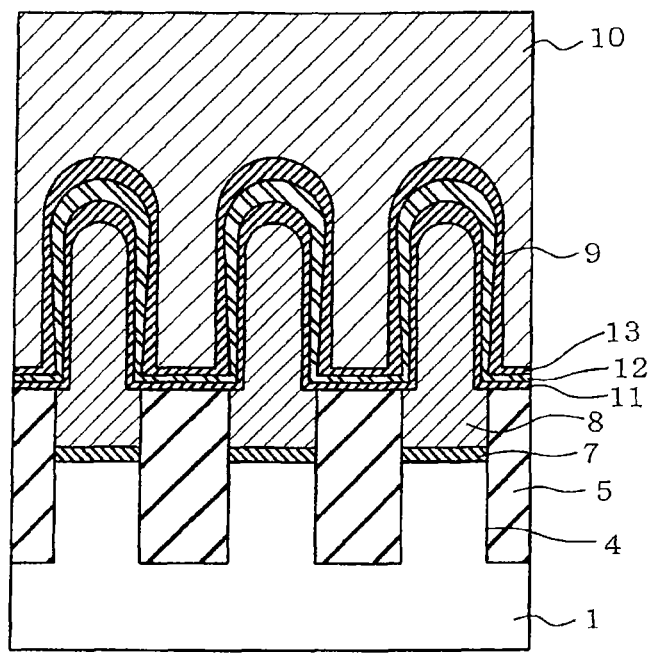
FIG. 15 corresponds to FIG. 10 and illustrates a third embodiment.

FIG. 15 illustrates a third embodiment and portions that are identical to the first embodiment are identified with identical reference symbols. As can be seen in FIG. 15, interelectrode insulating film 9 of the third embodiment is configured such that both first silicon oxide film 11 underlying the thick silicon nitride film 12 and third silicon oxide film 13 overlying the thick silicon nitride film 12 are made relatively thick in the region above the upper surface of floating gate electrode FG.

The manufacturing process flow of the third embodiment forms first silicon oxide film 11 with a deposition scheme exhibiting low step coverage such as PE-CVD and PE-ALD. Then, silicon nitride film 12 is similarly formed by a deposition scheme exhibiting low step coverage such as PE-CVD and PE-ALD as done in the first embodiment. Thereafter, second silicon oxide film 13 is formed above silicon nitride film 12 by a deposition scheme exhibiting low step coverage such as PE-CVD and PE-ALD as similarly done in forming first silicon oxide film 11. First silicon oxide film 11 and second silicon oxide film 13 are preferably formed using source gases such as TEOS+$O_2$ or TEOS+$H_2O$. The above described process flow allows formation of relatively thick first silicon oxide film 11, silicon nitride film 12, and second silicon oxide film 13 in the region located above the upper surface of floating gate electrode FG while making them thin at least in a portion of the region along the sidewall of floating gate electrode FG and in the region above element isolation insulating film 5. The rest of the structures of the third embodiment remain the same from those of the first embodiment and thus, the third embodiment is also similar to the first embodiment in operation and effect.

As described above, the third embodiment forms each of first silicon oxide film 11, silicon nitride film 12, and second silicon oxide film 13 relatively thick in the region located above the upper surface of floating gate electrode FG. This means that the thickness of interelectrode insulating film 9 located in this region is thicker compared to the first embodiment. Thus, the electric field applied on the upper surface of floating gate electrode FG is relaxed in greater magnitude as compared to the first embodiment. As a result, leakage current is reduced by a greater level to improve the programming properties more effectively as compared to the first embodiment.

Further, the third embodiment forms each of first silicon oxide film 11, silicon nitride film 12, and second silicon oxide film 13 relatively thin in at least a portion of the region located along the sidewall of floating gate electrode FG and in the region above element isolation insulating film 5. Thus, conductive film 10, later formed into control gate electrode CG, can be filled more easily between the floating gate electrodes FG.

Yet further, in the third embodiment, both first silicon oxide film 11 serving as the bottom oxide below silicon nitride film 12, and second silicon oxide film 13 serving as the top oxide above silicon nitride film 12 are made relatively thick in the region above the upper surface of floating gate electrode FG. Thus, charge which was trapped in silicon nitride film 12 during programming can be prevented from detrapping toward both floating gate electrode FG and control gate electrode CG, thereby providing a memory cell array with outstanding charge retention properties.

Figure 16:
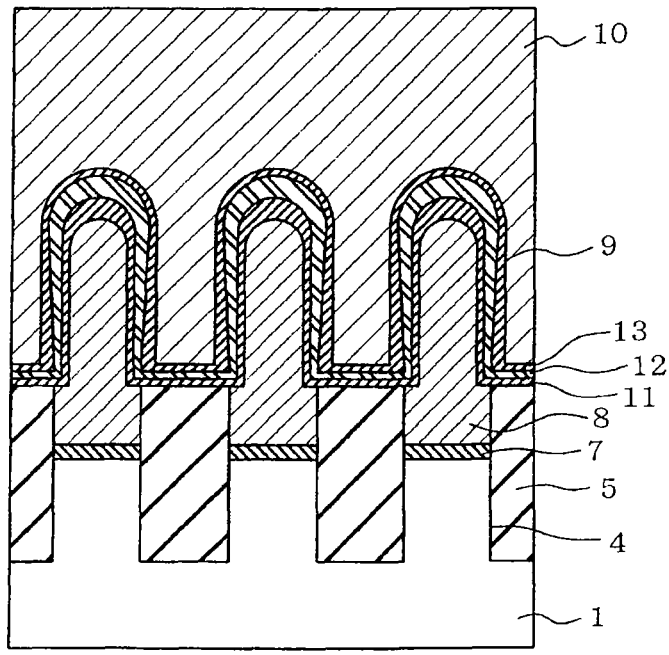
FIG. 16 corresponds to FIG. 10 and illustrates a fourth embodiment.

FIG. 16 illustrates a fourth embodiment and portions that are identical to the first embodiment are identified with identical reference symbols. Interelectrode insulating film 9 of the third embodiment was configured such that first silicon oxide film 11, silicon nitride film 12, and second silicon oxide film 13 were relatively thick in the region located above the upper surface of floating gate electrode FG. Alternatively, first silicon oxide film 11 and silicon nitride film 12 may be made relatively thick in the region located above the upper surface of floating gate electrode FG. Such configuration also provides operation and effect similar to those of the first embodiment.

Figure 17:
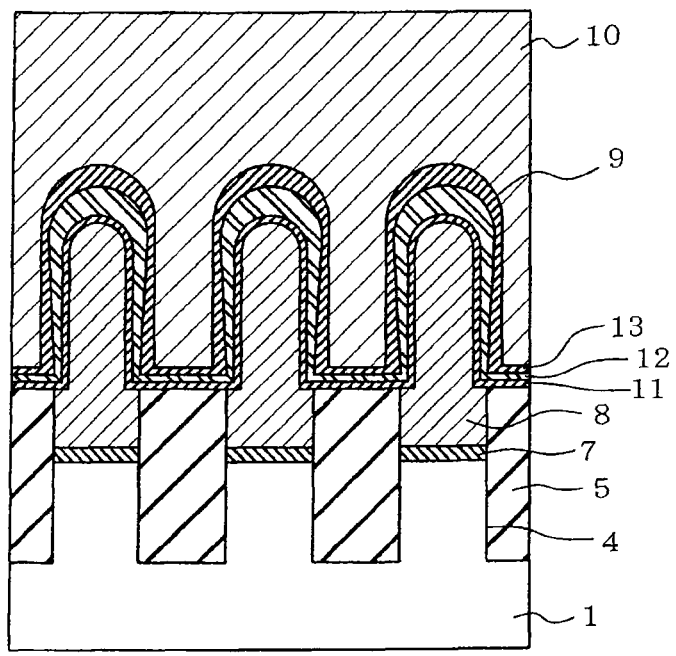
FIG. 17 corresponds to FIG. 10 and illustrates a fifth embodiment.

FIG. 17 illustrates a fifth embodiment and portions that are identical to the first embodiment are identified with identical reference symbols. Interelectrode insulating film 9 of the third embodiment was configured such that first silicon oxide film 11, silicon nitride film 12, and second silicon oxide film 13 were relatively thick in the region above the upper surface of floating gate electrode FG. Alternatively, silicon nitride film 12 and second silicon oxide film 13 may be made relatively thick in the region located above the upper surface of floating gate electrode FG. Such configuration also provides operation and effect similar to those of the first embodiment.

In the fifth embodiment, first silicon oxide film 11 serving as the bottom oxide located above floating gate electrode FG is not thickened in the region above the upper surface of floating gate electrode FG. This facilitates trapping of charge in silicon nitride film 12. In contrast, second silicon oxide film 13 serving as the top oxide located below control gate electrode CG is thickened in the region above the upper surface of floating gate electrode FG. This prevents charge trapped in silicon nitride film 12 from detrapping toward control gate electrode CG. The above described configuration improves programming saturation properties and widens the memory window, which in turn provides a memory cell array with outstanding charge retention properties.

The foregoing embodiments may be modified or expanded as follows.

Interelectrode insulating film 9 configured by an ONO stack including the bottom silicon oxide film 11, the middle silicon nitride film 12, and the top silicon oxide film 13 may further incorporate a silicon nitride film below silicon oxide film 11 to obtain a NONO stack. The bottom silicon nitride film may be formed above polycrystalline silicon layer 8 serving as floating gate electrode FG by radically nitriding the surface of polycrystalline silicon layer 8 or by depositing a silicon nitride film above polycrystalline silicon layer 8 by ALD or LP-CVD. The NONO stack also advantageously suppresses leakage current and provides a memory cell array with a wide memory window.

In case frequent oxidizing anneal is planned in the subsequent process flow to achieve greater reliability of the memory cell array, yet another additional silicon nitride film may be incorporated above silicon oxide film 13 of the NONO stack to obtain a NONON stack. The additional silicon nitride film may be formed above silicon oxide film 13 by radically nitriding the surface of silicon oxide film 13 or by depositing a silicon nitride film above silicon oxide film 13 by ALD or LP-CVD.

In case the conductive layers serving as floating gate electrode FG and control gate electrode CG and comprising a polycrystalline silicon layer in the foregoing embodiments are configured as P-type conductive layers, interelectrode insulating film 9 is preferably configured as an ONO stack to suppress fixed charge developing at the interfaces with the electrodes FG and CG.

As described above, interelectrode insulating film 9 includes a stack of first silicon oxide film 11, silicon nitride film 12, and second silicon oxide film 13 in which silicon nitride film 12 is formed relatively thick in the region located above floating gate electrode FG and relatively thin in the vicinity of the region located above the upper surface of element isolation insulating film 5. The above described structure advantageously reduces leakage current and narrows the threshold distribution.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   an element isolation region defined in the semiconductor substrate and having an element isolation insulating film formed therein;
   an active region defined in the semiconductor substrate delineated by the element isolation region;
   a gate insulating film formed in the active region;
   a charge storage layer formed above the gate insulating film;
   a multilayered interelectrode insulating film formed in a first region above an upper surface portion of the element isolation insulating film, a second region along a sidewall portion of the charge storage layer, and a third region above an upper surface portion of the charge storage layer; the interelectrode insulating film including a stack of first silicon oxide film, a silicon nitride film, and a second silicon oxide film, and the silicon nitride film being thicker in the third region compared to the first region and compared to at least a portion of the second region; and
   a control electrode layer formed above the interelectrode insulating film,
   the charge storage layer having a sharp pointed structure, a cross section of an upper portion of the charge storage layer being semielliptical,
   wherein a portion of the silicon nitride film formed along an entire extent of the sharp pointed structure in the upper portion of the charge storage layer having the cross section being semielliptical is thicker than a portion of the silicon nitride film of the first region, and
   wherein a portion of the silicon nitride film in the second region and portion of the silicon nitride in the first region have substantially equal thicknesses.

2. The device according to claim 1, wherein the silicon nitride film is absent in the first region.

3. The device according to claim 2, wherein the silicon nitride film is thinner in the second region than in the third region.

4. The device according to claim 3, wherein the silicon nitride film is absent in a portion of the second region located away from the third region.

5. The device according to claim 1, wherein the silicon nitride film is thinner in the second region than in the third region.

6. The device according to claim 5, wherein the silicon nitride film in the second region becomes gradually thinner as elevation decreases.

7. The device according to claim 6, wherein the silicon nitride film is absent in the first region.

8. The device according to claim 1, wherein the first silicon oxide film is thicker in the third region compared to the first region and compared to at least a portion of the second region.

9. The device according to claim 1, wherein the second silicon oxide film is thicker in the third region compared to the first region and compared to at least a portion of the second region.

10. The device according to claim 1, wherein the first silicon oxide film and the second silicon oxide film are thicker in the third region compared to the first region and compared to at least a portion of the second region.

11. The device according to claim 1, wherein the interelectrode insulating film further includes a second silicon nitride film between the charge storage layer and the first silicon oxide film.

12. The device according to claim 11, wherein the interelectrode insulating film further includes a third silicon nitride film between the second silicon oxide film 5 and the control electrode layer.

13. The device according to claim 1, wherein the interelectrode insulating film is formed directly on the upper surface of the charge storage layer and directly on the side surface of the charge storage layer, and wherein the control electrode layer is formed directly on the interelectrode insulating film.

14. A method of forming a semiconductor device according to claim 1, comprising:
   forming a gate insulating film above a semiconductor substrate;
   forming a charge storage layer above the gate insulating film;
   forming an element isolation trench into the charge storage layer, the gate insulating film, and the semiconductor substrate;
   filling the element isolation trench with an element isolation insulating film;
   exposing an upper surface and an upper sidewall of the charge storage layer;
   forming, in a first region above an upper surface portion of the element isolation insulating film, a second region along a sidewall portion of the charge storage layer, and a third region above an upper surface portion of the charge storage layer, a first silicon oxide film, a silicon nitride film above the first silicon oxide film, and a second silicon oxide film above the silicon nitride film to obtain a multilayered interelectrode insulating film, the silicon nitride film being formed relatively thicker in the third region compared to the first region and compared to at least a portion of the second region; and
   forming a control electrode layer above the interelectrode insulating film.

15. The method according to claim 14, wherein forming the silicon nitride film comprises a deposition process having low step coverage.

16. The method according to claim 15, wherein the deposition process comprises a plasma enhanced chemical vapor deposition or a plasma enhanced atomic layer deposition.

17. A method of forming a semiconductor device according to claim 1, comprising:
   forming a gate insulating film above a semiconductor substrate;
   forming a charge storage layer above the gate insulating film;
   forming an element isolation trench into the charge storage layer, the gate insulating film, and the semiconductor substrate;
   filling the element isolation trench with an element isolation insulating film;
   exposing an upper surface and an upper sidewall of the charge storage layer;
   forming, in a first region above an upper surface portion of the element isolation insulating film, a second region along a sidewall portion of the charge storage layer, and a third region above an upper surface portion of the charge storage layer, a first silicon oxide film, a silicon nitride film above the first silicon oxide film, and a second silicon oxide film above the silicon nitride film to obtain a multilayered interelectrode insulating film, the silicon nitride film being formed relatively thicker in the third region compared to at least a portion of the second region, and the silicon nitride film being dissipated at least in the first region; and forming a control electrode layer above the interelectrode insulating film.

18. The method according to claim 17, wherein forming the silicon nitride film comprises a deposition process having low step coverage which is followed by exposing the silicon nitride film to an atmosphere including oxidizing 5 radicals or $O_3$ and forming the second silicon oxide film above the silicon nitride film.

19. The method according to claim 18, wherein the deposition process comprises a plasma enhanced chemical vapor deposition or a plasma enhanced atomic layer deposition.

20. The method according to claim 17, wherein forming the silicon nitride film comprises a deposition process having low step coverage which is followed by forming the second silicon oxide film above the silicon nitride film such that the silicon nitride film at least in the first region is dissipated by oxidation.

21. The method according to claim 20, wherein the deposition process comprises a plasma enhanced chemical vapor deposition or a plasma enhanced atomic layer deposition.

* * * * *